United States Patent
Nunokawa (10) Patent No.: US 7,218,145 B2
(45) Date of Patent: May 15, 2007

(54) LEVEL CONVERSION CIRCUIT

(75) Inventor: Hideo Nunokawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 169 days.

(21) Appl. No.: 11/166,255

(22) Filed: Jun. 27, 2005

(65) Prior Publication Data

US 2006/0214685 A1    Sep. 28, 2006

(30) Foreign Application Priority Data

Mar. 28, 2005  (JP)  ............................. 2005-091407

(51) Int. Cl.
*H03K 19/094* (2006.01)
*H03K 19/0175* (2006.01)
*H03K 19/20* (2006.01)
*H03K 19/086* (2006.01)

(52) U.S. Cl. ............................. 326/68; 326/62; 326/63; 326/80; 326/81; 326/82; 326/83; 326/86; 326/87; 326/112; 326/115; 326/126; 326/127; 327/108; 327/109

(58) Field of Classification Search ............ 326/60–68, 326/80–83, 86, 87, 112, 115, 126, 127; 327/108, 327/109

See application file for complete search history.

(56) References Cited

U.S. PATENT DOCUMENTS

| | | | | | |
|---|---|---|---|---|---|
| 4,973,864 | A | * | 11/1990 | Nogami | 327/55 |
| 5,241,225 | A | * | 8/1993 | Okajima et al. | 326/73 |
| 5,469,080 | A | * | 11/1995 | Son | 326/81 |
| 5,675,278 | A | * | 10/1997 | Tanaka et al. | 327/333 |
| 6,121,793 | A | * | 9/2000 | Pickering et al. | 326/73 |
| 6,154,064 | A | * | 11/2000 | Proebsting | 327/55 |
| 6,184,716 | B1 | * | 2/2001 | Depetro et al. | 326/83 |
| 6,184,738 | B1 | * | 2/2001 | Iwamoto et al. | 327/333 |
| 6,331,797 | B1 | * | 12/2001 | Lambert | 327/333 |
| 6,563,362 | B2 | * | 5/2003 | Lambert | 327/333 |
| 6,897,684 | B2 | * | 5/2005 | Oi et al. | 326/86 |
| 6,963,226 | B2 | * | 11/2005 | Chiang | 326/68 |
| 7,005,913 | B2 | * | 2/2006 | Diffenderfer | 327/546 |
| 7,053,656 | B2 | * | 5/2006 | Seo | 326/68 |
| 2005/0068070 | A1 | * | 3/2005 | Diffenderfer | 327/112 |

FOREIGN PATENT DOCUMENTS

| | | |
|---|---|---|
| JP | 11-195975 | 7/1999 |
| JP | 2003-338178 | 11/2003 |

* cited by examiner

*Primary Examiner*—Rexford Barnie
*Assistant Examiner*—Dylan White
(74) *Attorney, Agent, or Firm*—Arent Fox LLP (57) ABSTRACT

An input circuit (a first transistor pair) that receives complementary input signals is connected to a latch circuit (a second transistor pair) that converts the amplitude of an input signal into second amplitude higher than first amplitude. A current mirror circuit (a third transistor pair) is disposed between the latch circuit and a high-level power supply line. The current mirror circuit makes a source voltage of the second transistors being turned on lower than the source voltage of the second transistors being turned off. The second transistors being turned on are likely to be turned off although the on-current of corresponding first transistors is low. To the contrary, the second transistors being turned off are likely to be turned on. Accordingly, even when a voltage of a high logic level of an input signal is low, the level conversion circuit can surely operate without malfunction.

7 Claims, 7 Drawing Sheets

LEVEL CONVERSION CIRCUIT

CROSS-REFERENCE TO RELATED APPLICATION

This application is based upon and claims the benefit of priority from Japanese Patent Application No. 2005-091407, filed on Mar. 28, 2005, the entire contents of which are incorporated herein by reference.

BACKGROUND OF THE INVENTION

1. Field of the Invention

The present invention relates to a level conversion circuit that converts a signal of low amplitude into a signal of high amplitude.

2. Description of the Related Art

The structure of transistors constituting a semiconductor integrated circuit is miniaturized every year in order to increase the degree of integration. Accordingly, a power supply voltage (an operating voltage) for driving the transistors tends to decrease. If the power supply voltage is lowered, the reliability of gate insulators of the transistors can be prevented from lowering. Further, the power supply voltage has a tendency to decrease so as to curtail power consumption.

Meanwhile, the interface specification of an external signal that is input and output to and from a semiconductor integrated circuit (or a semiconductor chip) need to be compatible with that of other semiconductor chips mounted in a system. For this reason, a power supply voltage of an internal circuit, such as a logic circuit formed within the semiconductor integrated circuit, is frequently different from that of an input/output circuit through which an external signal is input and output. In this case, in order to convert a high-level voltage that is output from the internal circuit to the input/output circuit into a high-level voltage that is dealt in the input/output circuit, a level conversion circuit (a level-up conversion circuit) is required.

The level conversion circuit is disclosed in, e.g., in Japanese Unexamined Patent Application Publication Nos. 11-195975 and 2003-338178. This kind of the level conversion circuit includes a pair of nMOS transistors each having the gate for receiving an input signal of low amplitude, and a latch that is composed of a pair of pMOS transistors connected to the drains of the nMOS transistors. The source of each of the pMOS transistors is applied with a high-level power supply voltage being a voltage of a high level and high amplitude. Further, an output signal having high amplitude is output from the drains of the pMOS transistors.

As described above, the power supply voltage applied to the internal circuit of the semiconductor integrated circuit has a tendency to decrease. Consequently, the high-level voltage of the input signal input to the level conversion circuit tends to be low. If the power supply voltage applied to the internal circuit becomes lower than a threshold voltage of the nMOS transistors that receive the input signal of the level conversion circuit, the on-current of the nMOS transistors become very low. As a result, a latch state of the pMOS transistors cannot vary. That is, if the power supply voltage applied to the internal circuit is low, the conventional level conversion circuit malfunctions, and thus cannot invert the output signal in response to variations of the input signal.

SUMMARY OF THE INVENTION

It is an object of the present invention to provide a level conversion circuit that can surely operate without fail even if a power supply voltage applied to an internal circuit is low.

In a level conversion circuit according to an aspect of the present invention, a pair of first transistors of an input circuit has first gates that respectively receive complementary input signals having a first amplitude. Second drains of a pair of second transistors of a latch circuit are connected to first drains, respectively. A second gate of one of the second transistors is connected to the second drain of the other of the second transistors. This causes one of the second transistors to be turned on and the other of the transistor to be turned off. The second transistors convert the amplitude of each of the input signals into second amplitude higher than first amplitude, and output the converted signal from the second drain of at least one of the second transistors as an output signal. A current mirror circuit includes a pair of third transistors in which third gates are connected to a third drain of one of the third transistors. The third drains of the third transistors are connected to second sources, respectively. Accordingly, the current mirror circuit can supply the same current to the sources of the second transistors. Third sources of the third transistors are connected to a high-level power supply line. In this case, to the high-level power supply line is applied a high-level power supply voltage being a voltage of a high logic level of the second amplitude.

The second sources of the second transistors that are turned on allow the current supplied from the current mirror circuit to flow through the second drains. The second sources of the second transistors that are turned off do not allow the current supplied from the current mirror circuit to flow through the second drains. Consequently, a source voltage of the second transistors that are turned on is lower than that of the second transistors that are turned off. Thus, the second transistors that are turned on are likely to be turned off although the on-current of the corresponding first transistors is low. To the contrary, the second transistors that are turned off are likely to be turned on. Accordingly, even when the first amplitude of an input signal is low and a voltage of a high logic level of a first amplitude is low, the level conversion circuit can convert an output signal in response to variations of a logic level of an input signal. That is, the level conversion circuit can surely operate without malfunction even when the voltage of the high logic level of the first amplitude is low.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENTS

Hereinafter, preferred embodiments of the present invention will be described with reference to the drawings. Signals with "/" attached to their heads indicate a negative logic level. Signal lines to which signals and a power supply voltage are supplied are assigned with the same reference numerals as those of signal names and power supply voltage names, respectively.

In a preferred example of a level conversion circuit according to an aspect of the present invention, an output signal is output only through the second drain of one of the second transistors. The pair of the third gates is connected to the second source of the second transistor, which output the output signal. In the case where the second transistor that outputs the output signal is turned on, the source voltage of the second transistor is lower than that of the other of the second transistors, as described above. As a result, since the voltage of the third gate is also lowered, a voltage between the gate and source of the third transistor becomes relatively high. Thus, as the on-current of the third transistor becomes relatively high, the latch circuit can operate at high speed. It is thus possible to increase the conversion rate of the level conversion circuit. Further, even when the pair of the third gates is connected to the second source of the second transistor, which does not output the output signal, the conversion rate of the level conversion circuit is not increased. However, the level conversion circuit surely operates without malfunction although a voltage of a high logic level of an input signal is low.

In a preferred example of a level conversion circuit according to an aspect of the present invention, the first transistors have the same gate widths as those of the second transistors. The ratio W/L of the gate width W and the channel length L of each of the first transistors is the same as the ratio W/L of the gate width W and the channel length L of each of the second transistors. In the present invention, as described above, even when the voltage of the high logic level of the input signal is low and the on-current of the first transistors is low, the level conversion circuit can operate. Therefore, in order to increase the on-current of the first transistors, it is not necessary to increase the gate width or the ratio W/L of the gate width W and the channel length L. As a result, the circuit size of the level conversion circuit can be made small.

In a preferred example of a level conversion circuit according to an aspect of the present invention, a fourth source of a fourth transistor of an inverting circuit is connected to a low-level power supply line. In this case, to the low-level power supply line is applied a low-level power supply voltage being a voltage of a high logic level of the first amplitude. The fourth transistor outputs the low-level power supply voltage through a fourth drain when a fourth gate receives the input signal of a low logic level. Gate insulators of the first, second and third transistors are formed to be thicker than a gate insulator of the fourth transistor. The thicker the gate insulator, the higher the threshold voltage. According to the present invention, even when a threshold voltage is high and the on-current is low, the level conversion circuit can certainly operate without malfunction.

In a preferred example of a level conversion circuit according to an aspect of the present invention, a fourth source of a fourth transistor of an inverting circuit is connected to a low-level power supply line. The fourth transistor outputs a low-level power supply voltage through a fourth drain when a fourth gate receives the input signal of a low logic level. Gate insulators of the first, second and third transistors are formed to have the same thickness as that of a gate insulator of the fourth transistor. Accordingly, as reliability of a gate breakdown voltage is secured, the level conversion circuit can operate at high speed when gate insulators of the level conversion circuit have a common thickness.

Figure 1:
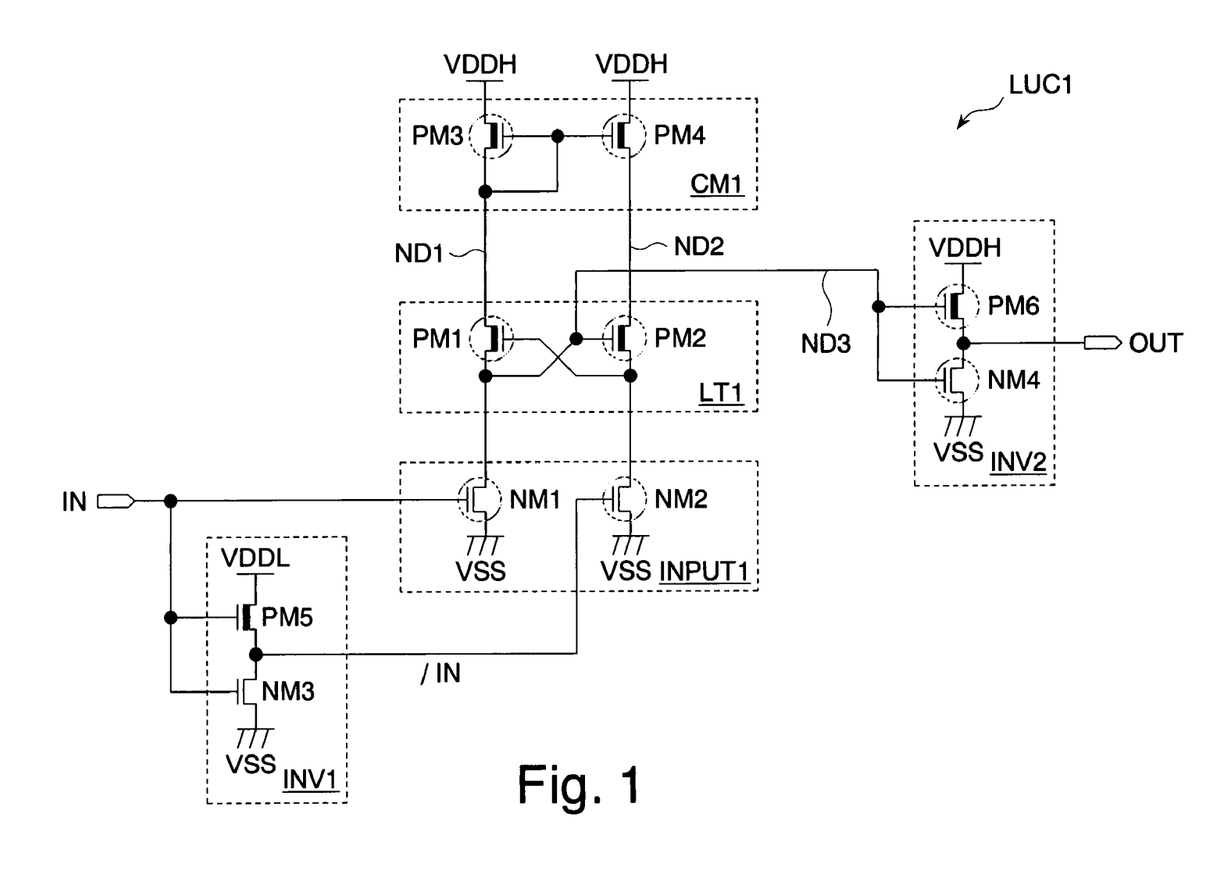
FIG. 1 is a circuit diagram of a level conversion circuit according to a first embodiment of the present invention.

FIG. 1 is a circuit diagram of a level conversion circuit according to a first embodiment of the present invention. In FIG. 1, transistors that are indicated by circles means that they have gate insulators thicker than those of transistors (standard transistors) that are not indicated by circles. That is, gate breakdown voltages of transistors that are indicated by circles are higher than those of the standard transistors. This is because a high voltage (e.g., VDDH) is applied to one of the source, gate and drain of the transistor that is indicated by a circle. For example, voltages of a high-level power supply line VDDH and a low-level power supply line VDDL can be 5.0 V and 1.0 V, respectively. For instance, a threshold voltage (an absolute value) of each of the transistors that is indicated by the circle can be designed to have 1.4 V. A threshold voltage (an absolute value) of each of the transistors that is not indicated by the circle can be designed to have 0.6 V.

A level conversion circuit LUC1 is formed within a semiconductor integrated circuit that is fabricated using e.g., CMOS technology. The level conversion circuit LUC1 includes an input circuit INPUT1 that receives complementary input signals IN and/IN, a latch circuit LT1 connected to the input circuit INPUT1, a current mirror circuit CM1 disposed between the latch circuit LT1 and the high-level power supply line VDDH, a CMOS inverter INV1 that inverts the input signal IN and generates the input signal /IN, and a CMOS inverter INV2 that generates an output signal OUT according to the output of the latch circuit LT1.

The input circuit INPUT1 includes a pair of nMOS transistors NM1 and NM2. The gates of the nMOS transistors NM1–2 receive the input signals IN and /IN, respectively. The sources of the transistors NM1–2 are connected to a ground line VSS. The latch circuit LT1 has a pair of pMOS transistors PM1 and PM2. The gate of the transistor PM1 is connected to the drain of the transistor PM2. The gate of the transistor PM2 is connected to the drain of the transistor PM1. The drain of the transistor PM1 is connected to the input of the inverter INV2 through a node ND3. That is, a logic level that is kept in the latch circuit LT1 is output from the transistor PM1.

The current mirror circuit CM1 includes a pair of pMOS transistors PM3 and PM4 whose gates are interconnected. The sources of the transistors PM3–4 are connected to a high-level power supply line VDDH. The inverter INV1 has a pMOS transistor PM5 and an nMOS transistor NM3. The sources of the transistors PM5 and NM3 are connected to a low-level power supply line VDDL and a ground line VSS, respectively. The inverter INV2 includes a pMOS transistor PM6 and an nMOS transistor NM4. The sources of the transistors PM6 and NM4 are connected to the high-level power supply line VDDH and the ground line VSS, respectively. The inverter INV2 receives the output of the latch circuit LT1, and outputs the output signal OUT having the same logic level as that of the input signal IN. In this case, a voltage of a high logic level of the output signal OUT is converted into the high-level power supply voltage VDDH. That is, the input signal IN having low amplitude is converted into the output signal OUT having high amplitude by means of the level conversion circuit LUC1.

In the present invention, as will be described hereinbelow, even when the on-current of the transistors NM1–2 is small, the transistors NM1–2 can easily invert the state of the latch circuit LT1. For this reason, a gate width W (not shown) of each of the transistors NM1–2 constituting the input circuit INPUT1 is designed to be the same as that of each of the transistors PM1–4. More particularly, the ratio W/L of the gate width W and a channel length L of each of the transistors NM1–2 is designed to be the same as the ratio W/L of a gate width W and a channel length L of each of the transistors PM1–4.

To the contrary, in the conventional level conversion circuit, the on-current of the transistors NM1–2 must be sufficiently high so as to invert the state of the latch circuit LT1. Due to this, the gate width of each of the transistors NM1–2 is designed to be approximately ten times greater than the gate width of each of the transistors PM1–4. If the present invention is employed, however, the circuit size of the level conversion circuit LUC1 can be made smaller than that of the prior art. It is therefore possible to cut down the chip size of the semiconductor integrated circuit LSI (FIG. 2) that forms the level conversion circuit LUC1.

In the level conversion circuit LUC1 shown in FIG. 1, the same current flows through nodes ND1 and ND2 of FIG. 1 by means of the action of the current mirror circuit CM1. One of the transistors PM1–2 of the latch circuit LT1 is turned on and the other thereof is turned off, according to a logic level of the input signal IN. The currents supplied to the sources of the transistors PM1–2 are the same. For example, if the transistor PM1 is turned on and the transistor PM2 is turned off, a source voltage of the transistor PM1 becomes lower than a source voltage of the transistor PM2. Therefore, the on-current of the transistor PM1 can be lowered compared to the prior art. Consequently, even when the on-current of the transistor NM1 of the input circuit INPUT1 is low and the drivability is low, the transistor PM1 that is turned on can be easily turned off. Furthermore, the source of the transistor PM1 (the gage of the transistor PM2) can be easily shifted to a low level even when the on-current of the transistor NM1 is low. As a result, the transistor PM2 that is turned off can be easily turned on.

As such, the transistor PM1 (or PM2) that is turned on is likely to be turned off, and the transistor PM2 (or PM1) that is turned off is likely to be turned on. Even when the voltage VDDL of a high logic level of the input signals IN and /IN is low, the level conversion circuit LUC1 can convert the high-level voltage VDDL into the high-level voltage VDDH without fail. That is, it is possible to prevent the level conversion circuit LUC1 from malfunctioning.

Furthermore, the gates of the transistors PM3–4 are connected to the source of the transistor PM1, which outputs a logic level whose level is shifted. If the transistor PM1 of the latch circuit LT1 is turned on, the source voltage (the node ND1) of the transistor PM1 becomes relatively low. In this case, a voltage between the gate and source of each of the transistors PM3–4 becomes relatively high, and the on-currents of the transistors become relatively high accordingly. Therefore, since the latch circuit LT1 operates at high speed, the conversion rate of the level conversion circuit LUC1 can be improved. The operating speed of the level conversion circuit LUC1 will be described in detail with reference to FIG. 5 (a second embodiment).

Figure 2:
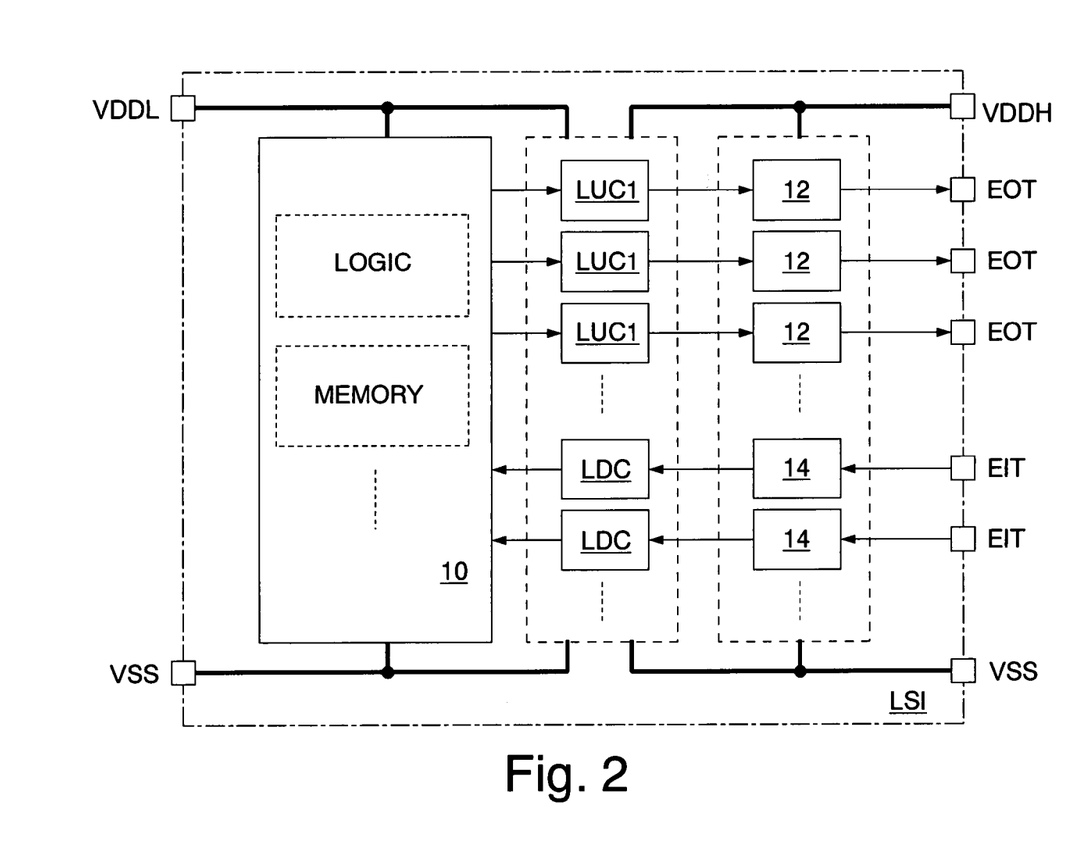
FIG. 2 is a block diagram of an example of a LSI to which the level conversion circuit is applied.

FIG. 2 is a block diagram showing an example of a semiconductor integrated circuit LSI having the level conversion circuit LUC1 shown in FIG. 1. The semiconductor integrated circuit LSI can be mounted in a board built in a clock in order to realize, e.g., a clock function. The semiconductor integrated circuit LSI includes an internal circuit 10, which has circuit blocks, such as a logic unit LOGIC and a memory unit MEMORY, and operates according to the low-level power supply voltage VDDL, output circuits 12 that output output signals from the internal circuit 10 to external output terminals EOT, input circuits 14 that output input signals received from external input terminals EIT to the internal circuit 10, level conversion circuits (level-up conversion circuits) LUC1 that convert the high-level voltage VDDL of a signal output from the internal circuit 10 into a high-level voltage VDDH, and level conversion circuits (level-down conversion circuits) LDC that convert the high-level voltage VDDH of a signal output from the input circuits 14 into the high-level voltage VDDL. The high-level voltage VDDH is the same as the high-level power supply voltage VDDH, and is applied through the power supply line VDDH. The high-level voltage VDDL is the same as the low-level power supply voltage VDDL, and is applied through the power supply line VDDL.

Figure 3:
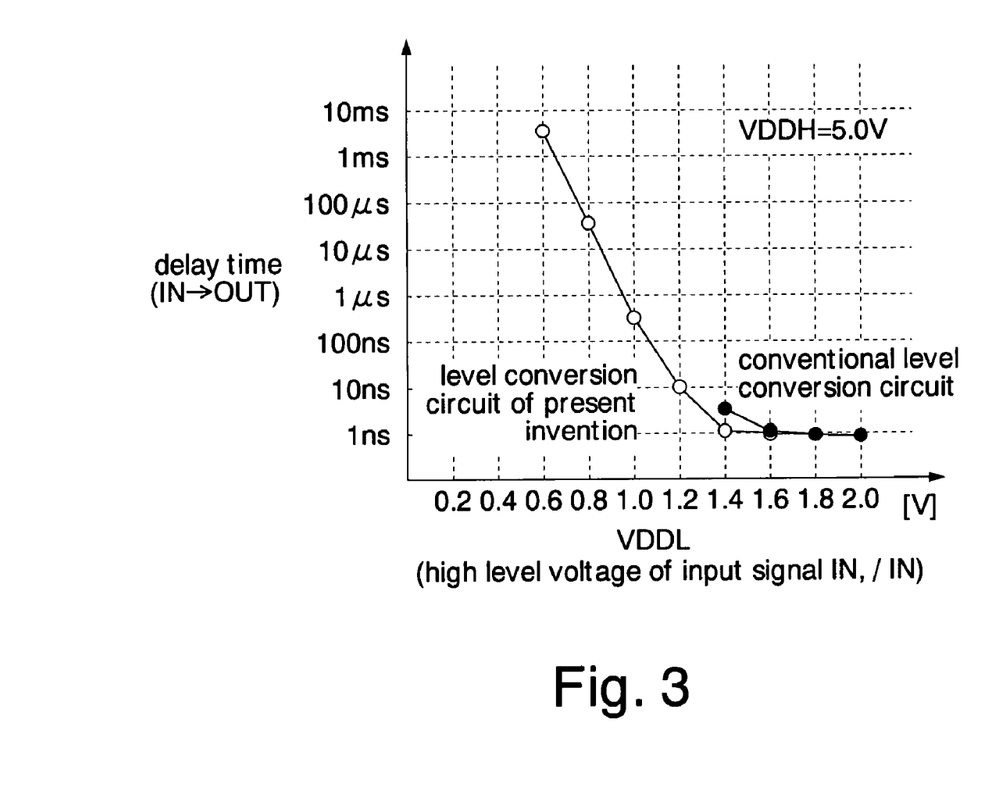
FIG. 3 is a characteristic view showing the operation of the level conversion circuit shown in FIG. 1.

FIG. 3 shows simulation results of the level conversion circuit LUC1 shown in shown in FIG. 1. In FIG. 3, a vertical axis indicates a delay time from when the input signal IN is shifted until the output signal OUT is shifted. An abscissa axis designates the low-level power supply voltage VDDL. A high-level voltage of the input signals IN and /IN is the same as the low-level power supply voltage VDDL. The high-level power supply voltage VDDH is 5.0 V. In addition, in the conventional level conversion circuit, the sources of the transistors PM1–2 of the latch circuit LT1 are directly connected to the high-level power supply line VDDH without the level conversion circuit LUC1 to the current mirror circuit CM1 shown in FIG. 1. Furthermore, in the conventional level conversion circuit, in order to easily invert the latch circuit LT1 by making high the on-current of each of the transistors NM1–2, the gate width W (or the ratio W/L of the gate width W and the channel length L) of each of the transistors NM1–2 is designed to be ten times greater than that of each of the transistors PM1–4.

In the level conversion circuit LUC1 according to the present invention and the conventional level conversion circuit, if one of the transistors NM1–2 having the gates applied with the high-level voltage (=VDDL) is turned on, one of the transistors PM1–2 of the latch circuit LT1 is turned on. The output (the drain of the transistor PM1) of the latch circuit LT1 is set to the ground voltage VSS or the high-level power supply voltage VDDH. That is, the high-level voltage VDDL of the input signals IN and /IN is converted into the high-level voltage VDDH.

In the level conversion circuit LUC1 (white circles in FIG. 3) according to the present invention, if the low-level power supply voltage VDDL is 0.6 V or more, the level conversion circuit LUC1 operates in normal manner. In other words, the level conversion circuit LUC1 can surely operate without malfunction even when the low-level power supply voltage VDDL is lower than a threshold voltage of the transistors NM1–2 of the input circuit INPUT1. An operating frequency of a semiconductor integrated circuit for use in a clock is generally 32 kHz (about 31 μs cycle). From the simulation results, it can be seen that when the low-level power supply voltage VDDL is 1.0 V, the delay time of the level conversion circuit LUC1 is about 200 ns. As a result, the level conversion circuit LUC1 can be used in a semiconductor integrated circuit for use in a clock with no problems.

To the contrary, in the conventional level conversion circuit (black circles in FIG. 3), the low-level power supply voltage VDDL (a high-level voltage of the input signals IN and /IN) is lower than 1.4 V. Thus, if the low-level power supply voltage VDDL becomes lower than the threshold voltage of the nMOS transistors NM1–2, the on-current of the transistor NM1 or NM2 of the input circuit INPUT becomes very low. Since the sources of the transistors PM1–2 of the latch circuit LT1 are directly connected to the high-level power supply line VDDH, it is difficult to invert the state of the latch circuit LT1 at a low on-current. For this reason, the conventional level conversion circuit cannot operate if the low-level power supply voltage VDDL is lower than 1.4 V although the size of the transistors NM1–2 is increased.

Moreover, the level conversion circuit LUC1 can normally operate even if the low-level power supply voltage VDDL is 0.6 V. Accordingly, as will be described in a fourth embodiment, the level conversion circuit LUC1 can be applied to a circuit for returning a semiconductor integrated circuit from the standby mode to the normal operating mode.

As described above, in the first embodiment, as the current mirror circuit CM1 is included in the level conversion circuit LUC1, the transistors PM1–2 that are turned on can be easily turned off, and the transistors PM1–2 that are turned off can be easily turned on. Therefore, even when the voltage VDDL of a high logic level of the input signals IN and /IN is low, the level conversion circuit LUC1 can surely execute the level conversion operation without malfunction. More particularly, even when the voltage VDDL of the high logic level of the input signals IN and /IN is lower than the threshold voltage of the transistors NM1–2 of the input circuit INPUT1, the level conversion circuit LUC1 can operate without fail.

By connecting the gates of the transistors PM3–4 of the current mirror circuit CM1 to the source of the transistor PM1, which outputs a logic level whose level is shifted, the voltage between the gate and source of the transistors PM3–4 when the transistor PM1 is turned on can be relatively made high. As the on-current of the transistors PM3–4 relatively increases, the latch circuit LT1 can operate at high speed. It is thus possible to enhance the conversion rate of the level conversion circuit LUC1.

The gate width W and the ratio of the gate width W and the channel length L of the transistors NM1–2 can be made the same as the gate width W and the ratio of the gate width W and the channel length L of the transistors PM1–4. Therefore, the size of the level conversion circuit LUC1 can be made small, and the chip size of the semiconductor integrated circuit LSI can be made small accordingly.

As the operating margin of the level conversion circuit LUC1 can be made high, i.e., the lowest limit of a voltage of a high logic level of the input signals IN and /IN can be lowered, gate insulators of transistors can be made relatively thick (a threshold voltage can be raised). More particularly, since a gate breakdown voltage of a transistor that receives the high-level power supply voltage VDDH can be increased, reliability of the level conversion circuit LUC1 can be improved. In other words, the level conversion circuit LUC1 considering a gate breakdown voltage can surely operate without malfunction.

Figure 4:
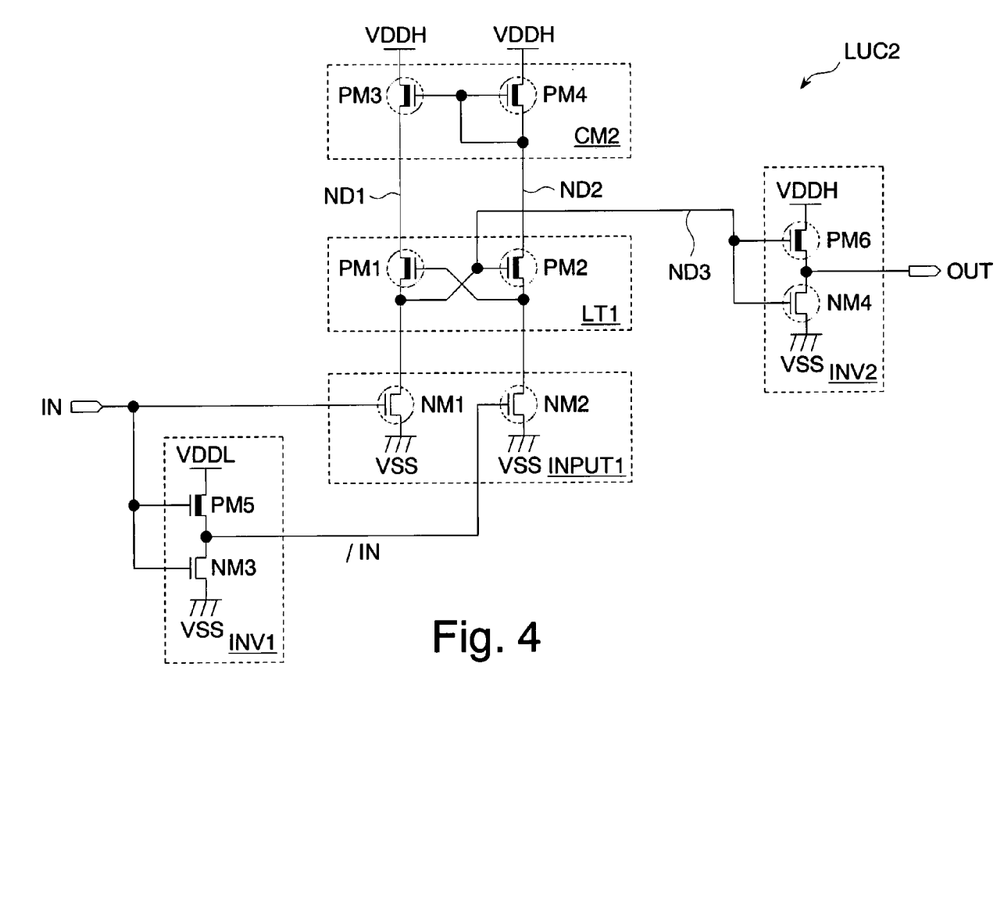
FIG. 4 is a circuit diagram of a level conversion circuit according to a second embodiment of the present invention.

FIG. 4 is a circuit diagram of a level conversion circuit according to a second embodiment of the present invention. The same reference numerals are used to identify the same parts as those described in the first embodiment, and detailed description thereof will be omitted. The level conversion circuit LUC2 of the present embodiment is the same as the level conversion circuit LUC1 of the first embodiment except that it has a current mirror circuit CM2 instead of the current mirror circuit CM1 of the first embodiment. The level conversion circuit LUC2 is formed within the semiconductor integrated circuit LSI, and converts the high-level voltage VDDL output from the internal circuit 10 into the high-level voltage VDDH that is used in the output circuits 12, in the same manner as the first embodiment (FIG. 2).

For example, voltages of the high-level power supply line VDDH and the low-level power supply line VDDL can be 5.0 V and 1.0 V, respectively. For instance, transistors that are indicated by circles have gate insulators that are relatively thick in order to increase a withstanding voltage, and have a threshold voltage (an absolute value) of 1.4 V. Transistors (standard transistors) that are not indicated by circles have gate insulator that are relatively thin, and have a threshold voltage (an absolute value) of 0.6 V. The gates of transistors PM3–4 of the current mirror circuit CM2 are connected to the source of the transistor PM2 whose drain is not connected to the output node ND3.

Figure 5:
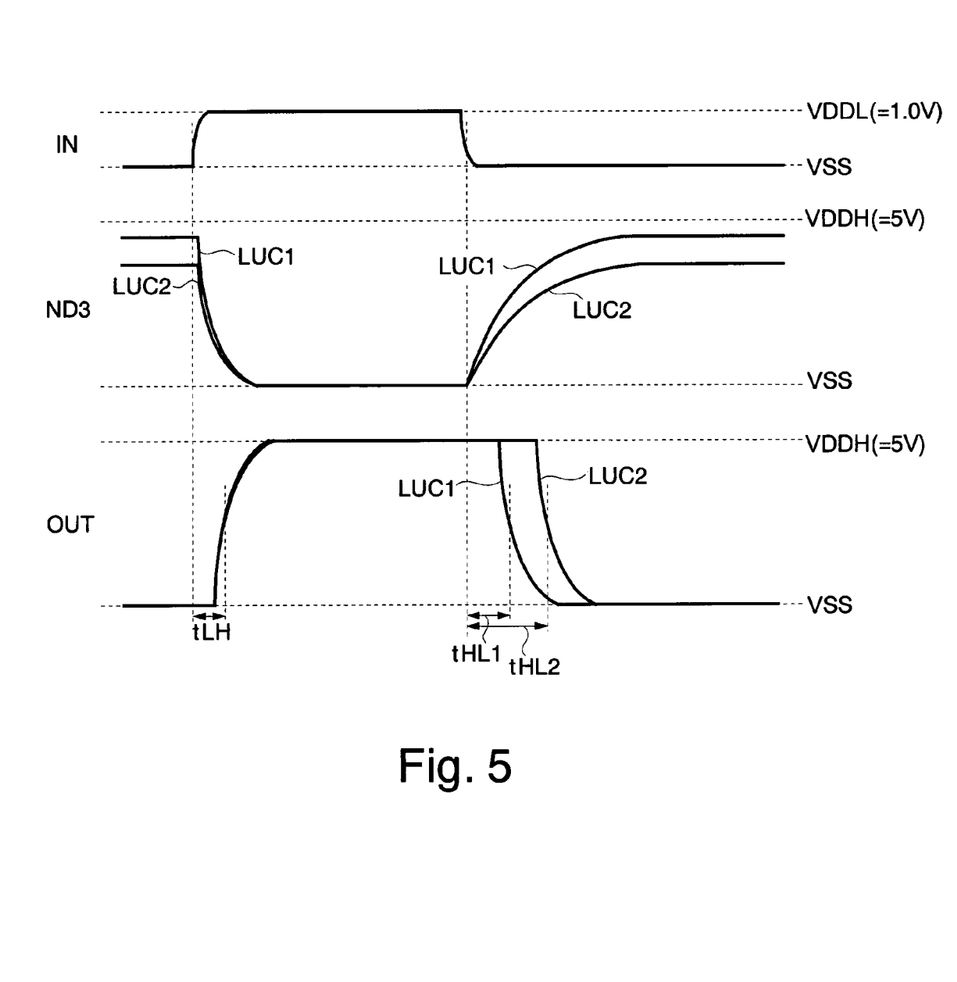
FIG. 5 shows a waveform illustrating the operation of the level conversion circuits according to the first and second embodiments.

FIG. 5 shows the operation (the results of circuit simulation) of the level conversion circuit LUC1 according to the first embodiment and the level conversion circuit LUC2 according to the second embodiment. When the input signals IN and /IN are a low level VSS and a high level VDDH, respectively, the transistor PM1 is turned on and the transistor PM2 is turned off in the latch circuit LT1 (FIGS. 1 and 4). Further, since the current mirror circuits CM1 and CM2 allow the same current to flow toward the sources of the transistors PM1–2, the voltage of the node ND1 is relatively lower than that of the node ND2. The voltage of the node ND2 becomes relatively higher than that of the node ND1.

In the current mirror circuit CM1 of the level conversion circuit LUC1, the gate voltages of the transistors PM3–4 is the same as a voltage of the node ND1. In the current mirror circuit CM2 of the level conversion circuit LUC2, the gate voltages of the transistors PM3–4 is the same as the voltage of the node ND2. Accordingly, as described in the first embodiment, the voltages between the gate and source of the transistors PM3–4 of the current mirror circuit CM1 become relatively high and the on-currents of the transistors PM3–4 become relatively high. Furthermore, the voltages between the gate and source of the transistors PM3–4 of the current mirror circuit CM2 become relatively low, and the on-currents of the transistors PM3–4 become relatively low. The source voltages (the voltages of the nodes ND1 and ND2) of the transistors PM1–2 of the level conversion circuit LUC1 become higher than the source voltages of the transistors PM1–2 of the level conversion circuit LUC2. Resultantly, as shown in FIG. 5, in a period where the input signal IN is at a low level (except for after the input signal IN is changed), the high-level voltage of the node ND3, which is the output of the latch circuit LT1, is higher in the level conversion circuit LUC1 than in the level conversion circuit LUC2.

A delay time tLH from the rise of the input signal IN to the fall of the output signal OUT is almost the same as that of the level conversion circuits LUC1 and LUC2. This is because the shift to a low level of the node ND3 is generally caused by the turn-on of the transistor NM1 of the input circuit INPUT1. Meanwhile, the delay time from the fall of the input signal IN to the rise of the output signal OUT is shorter in the level conversion circuit LUC1 (tHL1) than in the level conversion circuit LUC2 (tHL2). This is because the voltages of the nodes ND1 and ND2 of the level conversion circuit LUC1 are higher than those of the nodes ND1 and ND2 of the level conversion circuit LUC2, as described above.

As such, the operating speed of the level conversion circuit LUC2 is slower than that of the level conversion circuit LUC1. The lowest limit of the operating voltage VDDL is however the same as the characteristics of the level conversion circuit LUC1 shown in FIG. 3 (but, the delay time is a little long). That is, the second embodiment can also have the same effects as those of the first embodiment.

Figure 6:
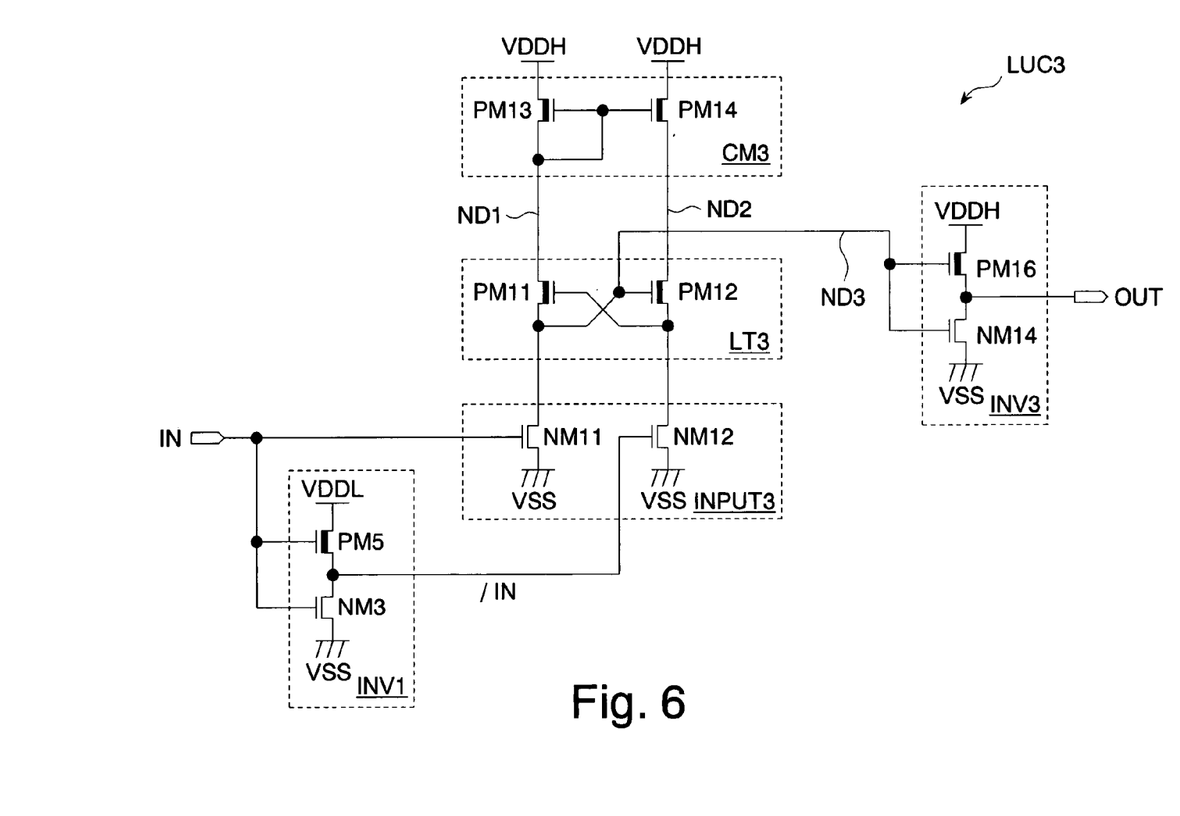
FIG. 6 is a circuit diagram of a level conversion circuit according to a third embodiment of the present invention.

FIG. 6 is a circuit diagram of a level conversion circuit according to a third embodiment of the present invention. The same reference numerals are used to identify the same parts as those described in the first embodiment, and detailed description thereof will be omitted. The level conversion circuit LUC3 of the present embodiment is the same as the level conversion circuit LUC1 of the first embodiment except that it has a current mirror circuit CM3, a latch circuit LT3, an input circuit INPUT3 and a CMOS inverter INV3, instead of the current mirror circuit CM1, the latch circuit LT1, the input circuit INPUT1 and the CMOS inverter INV2 of the first embodiment. The other components are the same as in the first embodiment. The level conversion circuit LUC3 is formed within a semiconductor integrated circuit LSI, and converts a high-level voltage VDDL output from the internal circuit 10 into a high-level voltage VDDH used in the output circuits 12, in the same manner as the first embodiment (FIG. 2).

In the present embodiment, voltages of the high-level power supply line VDDH and the low-level power supply line VDDL can be, e.g., 2.5 V and 1.0 V, respectively. pMOS transistors (with "PM" attached to the heads of their reference numerals) and nMOS transistors (with "NM" attached to the heads of their reference numerals), which are formed within the level conversion circuit LUC3, are all standard transistors, and have gate insulators whose thickness is equal to each other. For example, the gate insulators of the transistors PM11 and PM12 of the latch circuit LT3 can have the same thickness as those of transistors PM5 and NM3 of the inverter INV1. As such, in the event that a high-level power supply voltage VDDH is relatively low and reliability of a gate breakdown voltage of a transistor can be secured, the level conversion circuit LUC3 can be formed using the standard transistors. Accordingly, since the number of manufacturing processes such as a gate electrode can be cut down, a semiconductor manufacturing process can be simplified and the manufacturing cost can be curtained. In addition, in the same manner as the first embodiment, the gate width W and the ratio W/L of each of the transistors NM11–12 of the input circuit INPUT are designed to be the same as those of the transistors PM11–14.

Characteristics of the level conversion circuit LUC3 can be improved better than those of the first embodiment (FIG. 3). In more detail, as the lowest limit of the low-level power supply voltage VDDL is further lowered, the delay time can be shortened. This is because a threshold voltage of transistors that constitutes the current mirror circuit CM3, the latch circuit LT3, the input circuit INPUT3 and the inverter INV3 is lower than those of the first embodiment.

As described above, the third embodiment can also have the same effects as those of the first embodiment. Furthermore, in the present embodiment, the level conversion circuit LUC3 is constructed of the standard transistors according to the value of the high-level power supply voltage VDDH. It is thus possible to simplify the semiconductor manufacturing process. In addition, since the lowest limit of the low-level power supply voltage VDDL can be further lowered, the delay time of the level conversion circuit LUC3 can be shortened.

Figure 7:
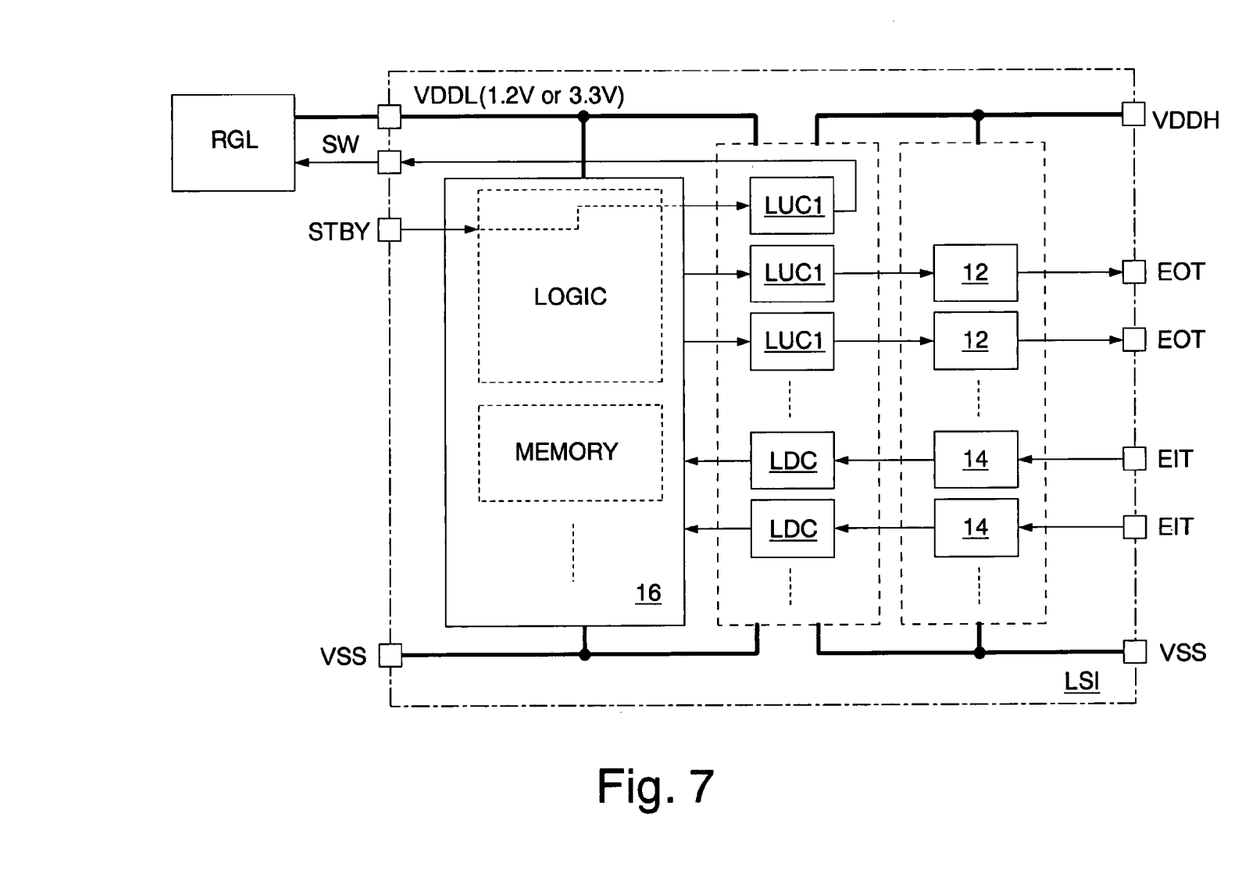
FIG. 7 is a block diagram of an example of a semiconductor integrated circuit to which a level conversion circuit in a level conversion circuit according to a fourth embodiment of the present invention is applied.

FIG. 7 shows an example of a semiconductor integrated circuit to which a level conversion circuit in a level conversion circuit according to a fourth embodiment of the present invention is applied. The same reference numerals are used to identify the same parts as those described in the first embodiment, and detailed description thereof will be omitted. In the present embodiment, the level conversion circuit LUC1 as shown in the first embodiment is formed within the semiconductor integrated circuit LSI.

The semiconductor integrated circuit LSI is mounted in, e.g., a digital camera, thereby realizing signal processing of the digital camera, etc. The semiconductor integrated circuit LSI includes an internal circuit 16, which has circuit blocks, such as a logic unit LOGIC and a memory unit MEMORY, and operates according to the low-level power supply voltage VDDL, output circuits 12 that output output signals from the internal circuit 16 to external output terminals EOT, input circuits 14 that output input signals received by external input terminals EIT to the internal circuit 10, level conversion circuits LUC1 that convert a high-level voltage VDDL of a signal output from the internal circuit 16 into a high-level voltage VDDH, and level conversion circuits LDC that convert a high-level voltage VDDH output from the input circuits 14 into a high-level voltage VDDL. The high-level voltage VDDH is the same as the high-level power supply voltage VDDH, and is applied through the power supply line VDDH. The high-level voltage VDDL is the same as the low-level power supply voltage VDDL, and is supplied through the power supply line VDDL.

Generally, a digital camera has a clock function built in. Thus, the semiconductor integrated circuit LSI needs to be applied with a power supply voltage in order to drive the clock even while a main switch (an operation switch) is turned off. For example, a regulator RGL applies a power supply voltage VDDL (1.2 V) to the semiconductor integrated circuit LSI in the standby mode in which the main switch is turned off, and applies a power supply voltage VDDL (3.3 V) to the semiconductor integrated circuit LSI in the operating mode in which the main switch is turned on.

The semiconductor integrated circuit LSI receives a power signal STBY indicating a main switch state, and outputs a switching signal SW, which indicates the switching of the low-level power supply voltage VDDL, to the regulator RGL through the logic unit LOGIC and the level conversion circuit LUC1. The power signal STBY shifts from a low level to a high level when the main switch is turned on, but shifts from a high level to a low level when the main switch is turned off.

When the main switch is turned off and the power signal STBY shifts from a high level to a low level accordingly, the level conversion circuit LUC1 can easily convert the switching signal SW from a high level to a low level because the low-level power supply voltage VDDL is sufficiently high (3.3 V). The regulator RGL drops the low-level power supply voltage VDDL from 3.3 V to 1.2 V in response to variations of the switching signal SW. This makes the digital camera stop other operations except for the clock function, and makes it transfer to the standby mode in which data stored in the latch and data stored in the memory unit MEMORY are maintained.

Meanwhile, when the main switch is turned on and the power signal STBY shifts from a low level to a high level accordingly, the low-level power supply voltage VDDL is (1.2 V). The level conversion circuit LUC1 can, however, operate in normal manner because the lowest limit of the voltage VDDL of a high logic level of the input signals IN and /IN is 0.6 V, as shown in FIG. 3. The level conversion circuit LUC1 converts the switching signal SW from a low level to a high level in response to the rising edge of the power signal STBY. The regulator RGL raises the low-level power supply voltage VDDL from 1.2 V to 3.3 V according to variations of the switching signal SW. Thereby, the digital camera switches from the standby mode to the operating mode in which photography is possible. Accordingly, the conventional level conversion circuit cannot convert the switching signal SW from a low level to a high level because the lowest limit of the voltage VDDL of the high logic level of the input signal IN is 1.4 V. That is, since the semiconductor integrated circuit LSI malfunctions, power of the digital camera cannot be turned on.

As described above, the fourth embodiment can also have the same effects as those of the first embodiment. Further, in the present embodiment, although the low-level power supply voltage VDDL supplied to the semiconductor integrated circuit LSI is converted according to an external request (the power signal STBY), the external request can be transferred to the regulator RGL using the level conversion circuit LUC1. This can prevent the semiconductor integrated circuit LSI from malfunctioning.

In addition, in the aforementioned embodiments, the latch circuits LT1 and LT3 can be constructed so that the complementary output signals are output through both the drains of the pair of the pMOS transistors.

In the above-described third embodiment, the gates of the transistors PM13–14 of the current mirror circuit CM3 can be connected to the source of the transistor PM11, which outputs a logic level whose level is shifted.

In the first, second and fourth embodiments, in the event that the high-level power supply voltage VDDH is low and the gate breakdown voltage of the transistor can be secured, a withstanding voltage of the transistor constituting the current mirror circuits CM1 and CM2, the latch circuit LT1, the input circuit INPUT1 and the CMOS inverter INV2 can have the same as that of the transistors PM5 and NM3 constituting the CMOS inverter.

The aforementioned level conversion circuits LUC1, LUC2 and LUC3 can be formed using bipolar technology instead of CMOS technology.

The invention is not limited to the above embodiments and various modifications may be made without departing from the spirit and scope of the invention. Any improvement may be made in part or all of the components.

What is claimed is:

1. A level conversion circuit comprising:
an input circuit which includes a pair of first transistors, each having a first gate, a first drain and a first source, and receives complementary input signals having a first amplitude through the first gates;
a latch circuit, which includes a pair of second transistors, each having a second gate, a second drain and a second source, and converts the amplitude of each of the input signals into a second amplitude higher than the first amplitude and then outputs the converted signal through the second drain of one of the second transistors as an output signal, the second drains being connected to the first drains, respectively, and the second gate of one of the second transistors being connected to the second drain of the other of the second transistors; and
a current mirror circuit which includes a pair of third transistors, each having a third gate, a third drain and a third source, the third drains being connected to the second sources, respectively, the third sources being connected to a high-level power supply line to which a high-level power supply voltage being a voltage of a high logic level of the second amplitude is applied, and the pair of the third gates being connected to the third drain of one of the third transistors.

2. The level conversion circuit according to claim 1, wherein
said output signal is output only through the second drain of one of the second transistors, and
the pair of said third gates are connected to the second source of the second transistor, which outputs said output signal.

3. The level conversion circuit according to claim 1, wherein
said output signal is output only through the second drain of one of the second transistors, and
the pair of the third gates is connected to the second source of the second transistor, which does not output said output signal.

4. The level conversion circuit according to claim 1, wherein
said first transistors have same gate widths as those of said second transistors.

5. The level conversion circuit according to claim 4, wherein
each of said first transistors have a same ratio W/L of a gate width W and a channel length L as that of each of said second transistors.

6. The level conversion circuit according to claim 1, further comprising an inverting circuit, which includes a fourth transistor having a fourth gate, a fourth drain and a fourth source, and outputs a low-level power supply voltage through said fourth drain when said fourth gate receives the input signal of a low logic level, said fourth source being connected to a low-level power supply line to which a low-level power supply voltage being a voltage of a high logic level of said first amplitude is applied, wherein
gate insulators of said first, second and third transistors are formed to be thicker than a gate insulator of said fourth transistor.

7. The level conversion circuit according to claim 1, further comprising an inverting circuit, which includes a fourth transistor having a fourth gate, a fourth drain and a fourth source, and outputs a low-level power supply voltage through said fourth drain when said fourth gate receives the input signal of a low logic level, said fourth source being connected to a low-level power supply line to which a low-level power supply voltage being a voltage of a high logic level of said first amplitude is applied, wherein
gate insulators of said first, second and third transistors are formed to have the same thickness as a gate insulator of said fourth transistor.

* * * * *